(12) United States Patent
Tani et al.

(10) Patent No.: US 7,064,553 B2
(45) Date of Patent: Jun. 20, 2006

(54) OPEN-CIRCUIT DETECTING CIRCUIT

(75) Inventors: Shinji Tani, Nishio (JP); Yoshichika Abe, Anjo (JP)

(73) Assignees: Anden Co., Ltd., Anjo (JP); Denso Corporation, Kariya (JP)

( * ) Notice: Subject to any disclaimer, the term of this patent is extended or adjusted under 35 U.S.C. 154(b) by 0 days.

(21) Appl. No.: 10/961,069

(22) Filed: Oct. 12, 2004

(65) Prior Publication Data
US 2005/0083066 A1    Apr. 21, 2005

(30) Foreign Application Priority Data
Oct. 15, 2003    (JP)    ............... 2003-355361

(51) Int. Cl.
*G01R 31/14*    (2006.01)
*G01R 31/08*    (2006.01)
(52) U.S. Cl. ...................... 324/509; 324/523
(58) Field of Classification Search ................ 324/509, 324/522, 523
See application file for complete search history.

(56) References Cited

U.S. PATENT DOCUMENTS 4,710,704 A * 12/1987 Ando .................... 324/103 R
5,087,884 A *  2/1992 Brannon ................... 324/523
6,377,053 B1*  4/2002 Mazzucco et al. .......... 324/523

FOREIGN PATENT DOCUMENTS

JP    A-9-89966    4/1997
JP    A-11-143530    5/1999

* cited by examiner

*Primary Examiner*—Diane Lee
*Assistant Examiner*—Timothy J. Dole
(74) *Attorney, Agent, or Firm*—Posz Law Group, PLC

(57) ABSTRACT

In an open-circuit detecting circuit, a current detecting circuit converts current flowing from a driving circuit to a load to a voltage. A comparator circuit compares the voltage with a reference voltage and outputs a signal according to a result of the comparison to a D flip-flop. An open-circuit is determined based on an output of the flip-flop, which is outputted when a clock signal indicating a falling edge of a PWM signal outputted from a PWM signal generating circuit is inputted.

11 Claims, 3 Drawing Sheets

OPEN-CIRCUIT DETECTING CIRCUIT

CROSS REFERENCE TO RELATED APPLICATION

This application is based on and incorporates herein by reference Japanese Patent Application No. 2003-355361 filed on Oct. 15, 2003.

FIELD OF THE INVENTION

The present invention relates to an open-circuit detecting circuit for easily detecting an open in a load or a break in a power supply line for supplying power to the load.

BACKGROUND OF THE INVENTION

When open-circuit detection is performed in a circuit, in which power supply to a load is repeatedly turns on and off, an open circuit may be erroneously detected in a condition that the power supply to the load is turned off. For instance, erroneous open circuit detection may occur if turn-on and turn-off of a load is controlled via pulse width modulation (PWM) control. No current flow through the load during a period that a PWM signal is low. If open-circuit is determined based on whether current flows through the load and the open-circuit determination is performed during this period, an open circuit is erroneously detected because no current flow through the load.

Furthermore, the open-circuit detection is performed by a CPU in synchronization with pulses of the PWM signal, namely, an interrupt operation is required every time a pulse of the PWM signal appears. As a result, processing in the CPU becomes complicated and processing time increases.

In this circuit, the open-circuit determination is performed based on a voltage across the load. Therefore, this circuit cannot be applied for detecting an open-circuit in a light emitting diode (LED) indicator system having multiple lines of LEDs, which are connected in parallel to each other. If a part of the multiple LED lines becomes open, the circuit cannot detect the open.

To solve the erroneous open-circuit determination problem, an open-circuit detecting circuit that performs open-circuit determination on a rising edge and a falling edge of a PWM signal is proposed in JP-A-9-89966. However, this circuit still produces an erroneous open-circuit detection result if a MOSFET is used for a driving element. A MOSFET produces a delay between time when a PWM signal becomes high and time when its output becomes high. This delay is referred to as a turn-on delay. An open circuit is erroneously determined during a period of the turn-on delay because an output of the MOSFET is still low if the open-circuit determination is performed only when the PWM signal is high.

A PWM control device that does not perform open-circuit determination during a period of the turn-on delay is proposed in JP-B2-3230471 to solve the above-described problem. However, extra processing is required for waiting until the period of the turn-on delay expires, and therefore a load on a CPU increases. To reduce the load on the CPU, a delay circuit is required. Thus, the number of circuits and components of the PWM control device increases. The same kinds of problem occur in shorted load detection.

SUMMARY OF THE INVENTION

The present invention therefore has the first objective to provide an open-circuit detecting circuit that detects an open or a short in a load without interrupt operation by a CPU. The present invention has the second objective to provide an open-circuit detecting circuit that can be applied to a system having multiple lines of loads, which are connected in parallel to each other. The present invention has the third objective to provide an open-circuit detecting circuit that can detects an open or short in the load without extra processing or a delay circuit.

An open-circuit detecting circuit of the present invention includes a driving circuit, an on-off signal generating circuit, a current detecting circuit, a comparator circuit, and a storage circuit. The driving circuit controls power supply to a load. The on-off signal generating circuit generates on-off signals for the on-off control of the power supply performed by the driving circuit. The current detecting circuit converts current flowing from the driving circuit to the load to a voltage. The comparator circuit compares the voltage with a reference voltage and outputs signals according to a result of the comparison. The storage circuit stores the result of the comparison until a falling edge appears in the on-off signal generated by the on-off signal generating circuit.

With this configuration, the open-circuit detection is performed when the load is on and it is not performed at timing when the load is turned on, that is, at a rising edge of the on-off signal. The open-circuit detection is not performed during time turn-on operation of the load is not completed. The open-circuit detection is performed without interrupt operation, or without delays due to a period required to execute instructions for complete an open-circuit determination process after the on-off signal has varied. Extra processing for waiting until such a delay time to expire or a delay circuit is not required.

This circuit can detect an open or a short in a part of the lines. A reference voltage of the comparator circuit of the present invention is set to a voltage calculated by adding a variation in a voltage drop when a predetermined number of LED lines become open to the voltage converted from the current. With this configuration, an open circuit can be detected when only a part of the LED lines becomes open.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENT

Figure 1:
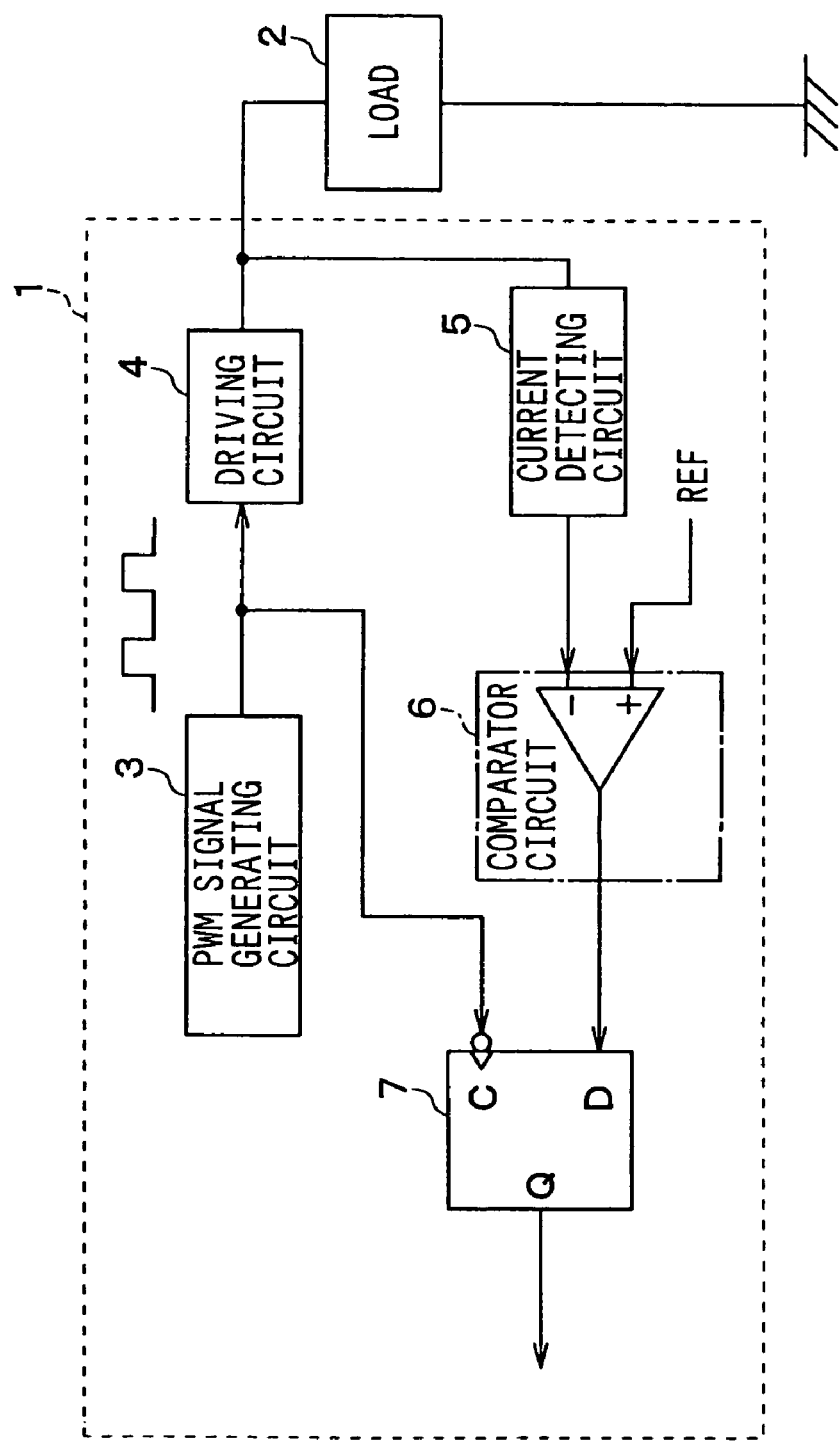
FIG. 1 is a block diagram of an open-circuit detecting circuit according to the first embodiment of the present invention.

The preferred embodiments of the present invention will be explained with reference to the accompanying drawings. In the drawings, the same numerals are used for the same components and devices.

First Embodiment

Referring to FIG. 1, an open-circuit detecting circuit 1 includes a pulse width modulation (PWM) signal generating circuit 3, a driving circuit 4, a current detecting circuit 5, a comparator circuit 6, and a D flip-flop 7. The open-circuit detecting circuit 1 detects an open circuit in a power supply line for supplying power to a load 2 and an open in the load 2.

The PWM signal generating circuit 3 is an on-off signal generating circuit that outputs PWM pulse signals (on-off signals) for indicating timing of power supply to the load 2. The outputted PWM signals are inputted to the driving circuit 4. The driving circuit 4 functions as a switch for controlling power supply to the load 2 based on the PWM signals inputted from the PWM signal generating circuit 3. The driving circuit 4 is a semiconductor switching element having a turn-on delay and a turn-off delay, such as a power MOSFET, connected between a power source and the load 2. When the PWM signal is high, the driving circuit 4 passes current, that is, power is supplied from the power source to the load 2. When the PWM signal is low, the driving circuit 4 does not pass the current, that is, power is not supplied from the power source to the load 2.

The current detecting circuit 5 detects the amount of current flowing into the load 2 via the driving circuit 4. It converts the amount of the current to a voltage and outputs the voltage to the comparator circuit 6 as a current signal. Namely, it functions as a signal transmitting circuit. It detects the amount of voltage drop at the driving circuit 4, that is, a voltage drop across the semiconductor switching element.

The current detecting circuit 5 is constructed of only wire. A voltage at a point between the load 2 and the driving circuit 4 is directly inputted to the comparator circuit 6. The current flowing into the load 2 is converted to the voltage by subtracting the voltage drop at the driving circuit 4 from the power source voltage.

The current detecting circuit 5 can be provided by a current mirror circuit that converts current flowing from the driving circuit 4 to the load 2 to current at a predetermined rate. In this case, a voltage drop at a resistor through which a predetermined amount of current is passed at a corresponding current mirror rate is inputted to the comparator circuit 6.

The comparator circuit 6 includes a comparator. The voltage that is obtained in the current detecting circuit 5 and a reference voltage are inputted to the comparator circuit 6 through an inverting input terminal and a noninverting input terminal, respectively. The comparator circuit 6 compares the voltage at the noninverting terminal with the reference voltage, and outputs a result of the comparison as a comparison signal. When the voltage is higher than the reference voltage, the comparator circuit 6 outputs a low-level signal. When the voltage is lower than the reference voltage, it outputs a high-level signal.

The flip-flop 7 stores the output of the comparator circuit 6, that is, the result of the comparison, until a falling edge of the PWM signal appears. The PWM signal is inverted and inputted to the flip-flop 7 as a clock signal. The flip-flop 7 outputs the signal outputted from the comparator 6 at timing when the falling edge appears and stores the output signal until next falling edge appears.

Operation of the open-circuit detecting circuit 1 will be discussed referring to a timing diagram shown in FIG. 2. An indicator unit having multiple light emitting diode (LED) lines connected in parallel is used for the load 2.

When the PWM signal becomes high, the current is passed from the driving circuit 4 to the load 2. Since the driving circuit 4 has a turn-on delay, the current does not flow through the load 2 at time t1 when the rising edge appears in the PWM signal. The current starts flowing through the load 2 at time t2 that lags behind time t1 by the turn-on delay. Thus, the current signal outputted from the current detecting circuit 5 rises at time t2.

The comparator circuit 6 compares a voltage of the current signal with the reference voltage when the current signal is inputted from the current detecting circuit 5. The voltage of the current signal is higher than the reference signal when no open circuit is present and normal current flows through the load 2. In this case, a low-level signal is outputted from the comparator circuit 6. This low-level signal is inputted to the flip-flop 7. However, the PWM signal has not yet fallen at this timing and therefore the flip-flop 7 continues to output the stored output of the comparator circuit 6. The timing diagram shows that the output of the flip-flop 7 is low, which indicates that no open circuit is present.

The current does not start flowing at time t3 when the falling edge appears in the PWM signal due to the turn-off delay of the driving circuit 4. The current starts flowing at time t4 that lags behind time t3 by the turn-off delay. Thus, the current signal outputted from the current detecting circuit 5 falls at time t4.

The current signal has not yet fallen at time t3 and therefore the comparator circuit 6 outputs a signal based on the current signal at that time. The comparator circuit 6 compares the voltage of the current signal with the reference voltage under the condition that the current flows from the driving circuit 4 to the load 2. Then, it outputs a signal indicating a result of the comparison.

The output of the comparator circuit 6 remains low if no open circuit is present, and therefore the low-level signal is inputted to the flip-flop 7. The flip-flop 7 outputs a signal indicating the outputs of the comparator 6 based on the clock input indicating the falling edge of the PWM signal. If a part of the LED lines becomes open, the amount of current from the driving circuit 4 decreases and the current signal varies. For example, the current signal becomes smaller as the number of open LED lines increases, and becomes smaller than the reference voltage when the number of the open LED lines reaches a predetermined number. The voltage level of the signal outputted from the comparator circuit 6 varies from a low-level, which is outputted under the condition that no open line is present, to a high-level. As a result, an open in the power supply line or the load 2 can be detected based on the variation.

Figure 2:
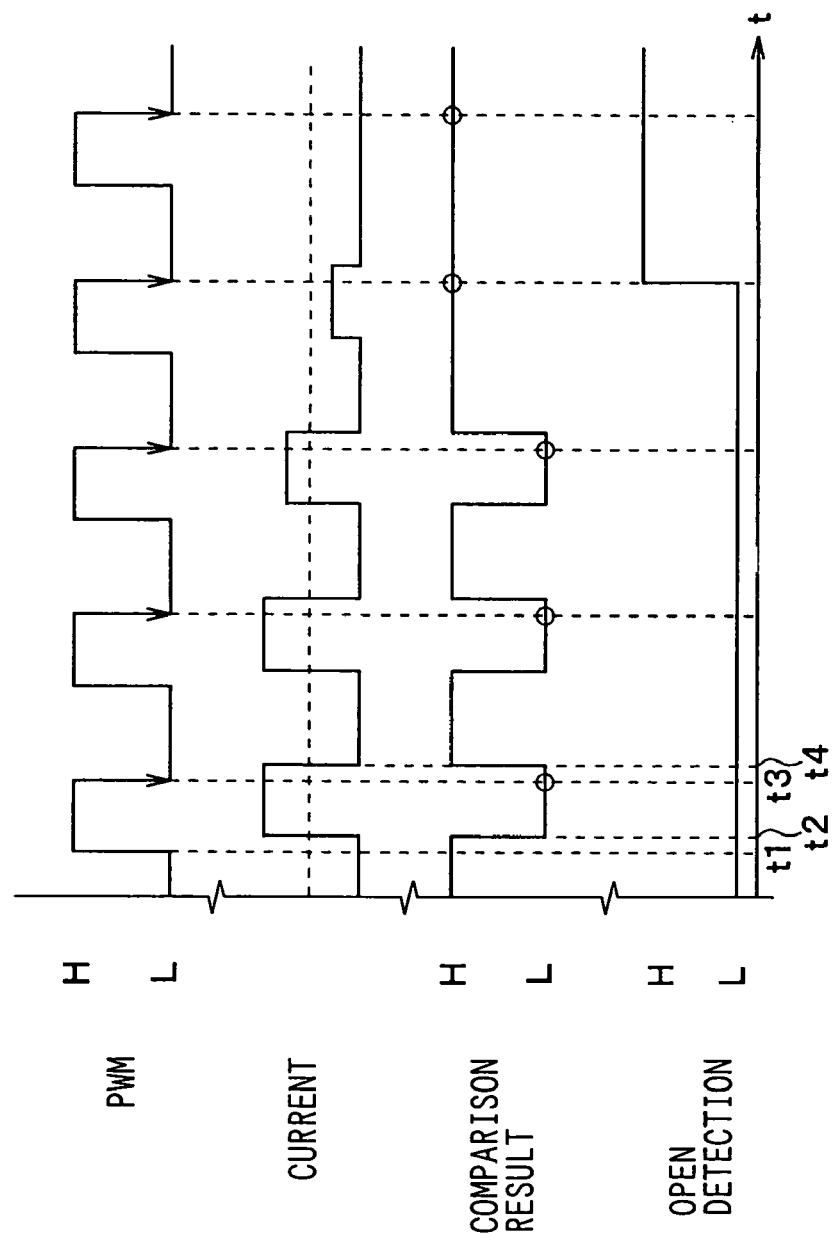
FIG. 2 is a timing diagram showing operating conditions of the open-circuit detecting circuit according to the first embodiment.

In FIG. 2, the current signal decreases as the number of open LED lines increases. However, the current signal increases as the number of open LED lines increases in the case that the driving circuit 4 is constructed of a semiconductor switching element. In this case, the current signal is produced by subtracting the voltage drop at the driving circuit 4 from the source voltage. Thus, the current signal increases as the number of open LED lines increases.

The current signal outputted from the current detecting circuit 5 is compared with the reference voltage and the result of the comparison is inputted to the flip-flop 7. The flip-flop 7 outputs a signal indicating a level of its input voltage when the clock signal indicating a falling edge of the PWM signal is inputted. As a result, the open-circuit detection is performed when the load 2 is on. The open-circuit detection is not performed at the time when the load 2 is turned on, namely, at the time when a rising edge appears in the PWM signal. The open-circuit detection is not performed until the turn-on operation of the load 2 is completed.

Transmission of the open-circuit detection result is controlled by the D flip-flop 7. The control by the D flip-flop 7 is implemented with a simple configuration and a CPU is not required to perform interrupt operation at each different pulse. Moreover, a delay due to time required for executing necessary processes for the open-circuit detection after the PWM signal has varied can be reduced. The CPU does not perform a process to wait by the delay. Namely, such an unnecessary process is omitted. Furthermore, the open-circuit detection can be performed without connecting a delay circuit.

With the above-described configuration, the open-circuit detection can be properly performed even when a period or a duty cycle of the PWM signal is altered. Moreover, the open-circuit detection can be properly performed even when the driving signal is in a simple pulse form instead of the PWM signal.

An open-circuit in a part of the load 2 can be detected by adjusting the reference voltage for the open-circuit detection. When the load 2 has multiple LED lines, an open circuit in some of the multiple LED lines can be detected. To implement this detection, the reference voltage is set to a voltage calculated by adding a variation in a voltage drop at the driving circuit 4 to the voltage obtained in the current detecting circuit 5. The variation occurs when a predetermined number of LED lines become open.

An indicator system having multiple lines of LEDs as the load 2 can be applied to an indicator system of a vehicle. However, the LEDs immediately become bright and immediately become dark, unlike the incandescent lamp currently used widely in vehicles, which gradually becomes bright and gradually becomes dark. As a result, a driver of the vehicle or drives of other vehicle may have unusual feelings.

To solve this problem, the PWM signal generating circuit 3 shortens the pulse width during turning-on of the LEDs or turning-off of the LEDs to reduce the amount of current flowing through the LEDs per unit time. With this operation, the LEDs gradually become bright or gradually become dark as the incandescent lamp. However, the delay processing by the CPU becomes complex because the PWM signal may become low at time when the indicator system is turned on. This problem can be solved by using the turn-off delay of the driving circuit 4.

Second Embodiment

Figure 3:
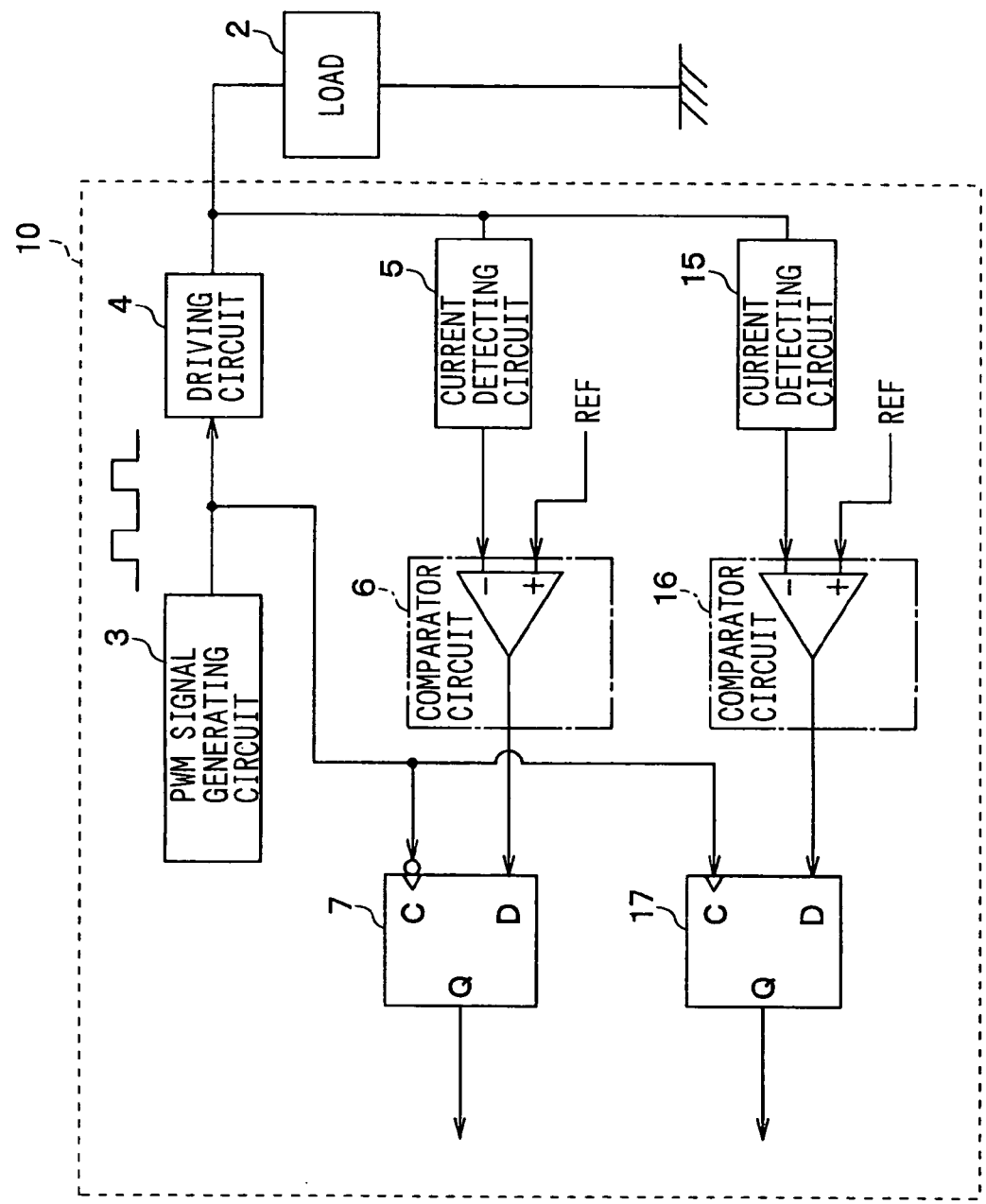
FIG. 3 is a block diagram of an open-circuit detecting circuit according to the second embodiment of the present invention.

Referring to FIG. 3, an open-circuit detecting circuit 10 includes the current detecting circuit 5, the comparator circuit 6, and the flip-flop 7 as the first current detecting circuit, the first comparator circuit, and the first storage circuit, respectively. The voltage converted by the current detecting circuit 5 corresponds to the first voltage. The comparison between the first voltage and the reference voltage corresponds to the first comparison. The open-circuit detecting circuit 10 further includes the second current detecting circuit 15, the second comparator circuit 16, and the second D flip-flop 17. They form a shorted load detecting circuit.

When the current flowing from the driving circuit 4 to the load 2 is converted to a voltage by the current detecting circuit 15, the voltage is compared with the reference voltage by the comparator circuit 16. The voltage converted by the current detecting circuit 15 corresponds to the second voltage and the comparison between the second voltage and the reference voltage corresponds to the second comparison.

An output of the comparator circuit 16 is inputted to the flip-flop 17. A signal is inputted from the PWM signal generating circuit 3 to the flip-flop 17 as a clock signal at a rising edge of the PWM signal. The flip-flop 17 stores the output of the comparator circuit 6 until a rising edge appears in the PWM signal.

The shorted load detection is performed at the rising edge of the PWM signal shown in FIG. 2. If a short is not present in the load 2, no current is passed because of the turn-on delay of the driving circuit 4. If a short is present, the current is passed to the load 2 and the current signal outputted by the current detecting circuit 5 does not become zero. As a result, the output of the comparator circuit 16 becomes high and the flip-flop 17 outputs the high-level signal. A short is detected based on the output of the flip-flop 17.

If the driving circuit 4 is a switch, such as a semiconductor switching circuit, no current flow through the load 2 when a short is present in the load 2. If the load 2 is shorted, a potential difference between the load 2 and the driving circuit 4 becomes equal to a ground potential. Thus, a short in the load 2 can be detected by directly inputting the potential difference to the comparator circuit 6 and comparing it with the reference voltage.

The present invention should not be limited to the embodiment previously discussed and shown in the figures, but may be implemented in various ways without departing from the spirit of the invention. For example, a shorted load detecting circuit can be provided separately from the open-circuit detecting circuit 1. The on-off signal may be generated by a circuit that has a function to adjust a frequency of the on-off signal as appropriate.

What is claimed is:

1. An open-circuit detecting circuit comprising:
a driving circuit for controlling power supply to a load;
an on-off signal generating circuit for generating a on-off signal for controlling power supply to the driving circuit;
a current detecting circuit for converting current flowing from the driving circuit to the load to a voltage;
a comparator circuit for comparing the voltage with a reference voltage and outputs a signal according to a result of the comparison; and
a storage circuit for storing the result of the comparison until a falling edge appears in the on-off signal
wherein:
the driving circuit is a switch connected between a power source and the load;
the current detecting circuit obtains a voltage calculated by subtracting a voltage drop at the driving circuit from a source voltage, determines the calculated voltage as the voltage converted from the current flowing from the driving circuit to the load, and outputs the calculated voltage to the comparator circuit;
the load is a light emitting diode indicator unit having a plurality of lines of light emitting diodes, the lines connected in parallel to each other; and
the reference voltage is set to a voltage calculated by adding a variation in a voltage drop at the driving circuit when a predetermined number of light emitting diode lines become open to the voltage converted from the current flowing from the driving circuit to the load.

2. The open-circuit detecting circuit according to claim 1, wherein the storage circuit is a D flip-flop that receives the signal outputted from the comparator circuit and a signal indicating the falling edge of the on-off signal as a clock signal.

3. The open-circuit detecting circuit according to claim 1, wherein the driving circuit is a semiconductor switching element.

4. A detecting circuit comprising:
a driving circuit switchably controlling a power supply to a load, the driving circuit driven by a pulse width modulation (PWM) signal;
a current detecting circuit converting a current flowing from the driving circuit to the load to a voltage;
a comparator circuit comparing the voltage with a reference voltage and outputting a signal according to a result of the comparison; and
a storage circuit coupled to the comparator circuit and the PWM signal, the storage circuit storing the result of the comparison based on a state of the PWM signal,
wherein:
the current detecting circuit obtains the voltage by:
subtracting a voltage drop at the driving circuit from a source voltage to generate a subtracted voltage,
determining that the subtracted voltage is the voltage converted from the current flowing from the driving circuit to the load, and
outputting the subtracted voltage to the comparator circuit as the voltage;
the load includes a light emitting diode indicator unit having a plurality of lines of light emitting diodes, the lines connected in parallel to each other; and
the reference voltage is set by adding a variation to the voltage drop at the driving circuit when a predetermined number of light emitting diode lines become open to the voltage converted from the current flowing from the driving circuit to the load.

5. The detecting circuit according to claim 4, wherein the driving circuit includes a semiconductor switching element.

6. The detecting circuit according to claim 4, wherein the detecting circuit detects a condition including one of an open-circuit condition and a short-circuit condition.

7. The detecting circuit according to claim 4, wherein the state includes one of rising edge state and a falling edge state.

8. The detecting circuit according to claim 4, wherein the state includes one of rising edge state associated with detecting a short-circuit condition and a falling edge state associated with detecting an open circuit condition.

9. The detecting circuit according to claim 4, wherein:
the switchably controlling includes switching the power supply to the load according to an on-off signal, the on-off signal offset from the PWM signal by a turn-on delay;
the storage circuit stores the result of the comparison until one of a rising edge and a falling edge of the PWM signal thereby accounting for the turn-on delay to provide accurate detection of one of an open circuit condition and a short circuit condition.

10. The detecting circuit according to claim 4, wherein:
the switchably controlling includes switching the power supply to the load according to an on-off signal, the on-off signal offset from the PWM signal by a turn-on delay;
the storage circuit outputs the result of the comparison on a rising edge of the PWM signal thereby providing accurate detection of a short circuit condition.

11. The detecting circuit according to claim 4, wherein:
the switchably controlling includes switching the power supply to the load according to an on-off signal, the on-off signal offset from the PWM signal by a turn-on delay;
the storage circuit stores the result of the comparison until a falling edge of the PWM signal thereby providing accurate detection of an open circuit condition.

* * * * *